United States Patent
Resnick

(10) Patent No.: US 10,019,310 B2
(45) Date of Patent: *Jul. 10, 2018

(54) ERROR CORRECTION IN MULTIPLE SEMICONDUCTOR MEMORY UNITS

(71) Applicant: Micron Technology, Inc., Boise, ID (US)

(72) Inventor: David R. Resnick, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 14/451,227

(22) Filed: Aug. 4, 2014

(65) Prior Publication Data

US 2014/0344644 A1 Nov. 20, 2014

Related U.S. Application Data

(63) Continuation of application No. 12/259,949, filed on Oct. 28, 2008, now Pat. No. 8,799,743.

(51) Int. Cl.
*G06F 11/00* (2006.01)
*G06F 11/10* (2006.01)
*H03M 13/05* (2006.01)
*G11C 29/04* (2006.01)

(52) U.S. Cl.
CPC ........ *G06F 11/1004* (2013.01); *G06F 11/108* (2013.01); *G06F 11/1044* (2013.01); *H03M 13/05* (2013.01); *G11C 2029/0411* (2013.01); *H01L 2224/05573* (2013.01); *H01L 2224/13025* (2013.01); *H01L 2224/16146* (2013.01); *H01L 2224/16227* (2013.01); *H01L 2224/17181* (2013.01); *H01L 2924/00014* (2013.01); *H01L 2924/15313* (2013.01)

(58) Field of Classification Search
CPC combination set(s) only.
See application file for complete search history.

(56) References Cited

U.S. PATENT DOCUMENTS

| | | |
|---|---|---|
| 5,258,984 A | 11/1993 | Menon et al. |
| 5,404,495 A | 4/1995 | Yoneda et al. |
| 5,680,579 A | 10/1997 | Young et al. |
| 6,092,215 A | 7/2000 | Hodges et al. |
| 7,945,752 B1 | 5/2011 | Miller et al. |
| 8,799,743 B2 | 8/2014 | Resnick |

(Continued)

FOREIGN PATENT DOCUMENTS

| | | |
|---|---|---|
| JP | 02194457 A | 8/1990 |
| JP | 2005108224 A | 4/2005 |

(Continued)

OTHER PUBLICATIONS

"Chinese Application Serial No. 200980147989.6, Office Action dated Jul. 23, 2013", 33 pgs.

(Continued)

*Primary Examiner* — Gabriel Chu
(74) *Attorney, Agent, or Firm* — Schwegman Lundberg & Woessner, P.A.

(57) ABSTRACT

Various embodiments include apparatus and methods to store data in a first semiconductor memory unit and to store error correction information in a second semiconductor memory unit to recover the data. The error correction information has a value equal to at least the value of the data store in the first memory unit.

8 Claims, 10 Drawing Sheets

(56) References Cited

U.S. PATENT DOCUMENTS

| | | |
|---|---|---|
| 2001/0039632 A1 | 11/2001 | MacLaren et al. |
| 2002/0194530 A1 | 12/2002 | Santeler et al. |
| 2003/0200388 A1 | 1/2003 | Hetrick |
| 2003/0110306 A1 | 6/2003 | Bailis et al. |
| 2004/0016939 A1 | 1/2004 | Akiba et al. |
| 2004/0163028 A1 | 8/2004 | Olarig |
| 2005/0071554 A1 | 3/2005 | Thayer et al. |
| 2006/0101202 A1 | 5/2006 | Mannen et al. |
| 2006/0218467 A1 | 9/2006 | Sibigtroth et al. |
| 2007/0050688 A1 | 3/2007 | Thayer |
| 2007/0214316 A1 | 9/2007 | Kim |
| 2008/0022163 A1 | 1/2008 | Tanaka et al. |
| 2008/0098158 A1 | 4/2008 | Kitahara |
| 2008/0155160 A1 | 6/2008 | McDaniel |
| 2008/0201392 A1 | 8/2008 | Nakajima et al. |
| 2008/0203575 A1 | 8/2008 | Thomas et al. |
| 2008/0282264 A1 | 11/2008 | Chen et al. |
| 2008/0320214 A1 | 12/2008 | Ma et al. |
| 2009/0037652 A1 | 2/2009 | Yu et al. |
| 2010/0049914 A1 | 2/2010 | Goodwin |
| 2010/0107036 A1 | 4/2010 | Resnick |

FOREIGN PATENT DOCUMENTS

| | | |
|---|---|---|
| JP | 2008204041 A | 9/2008 |
| KR | 101712215 | 2/2017 |
| WO | WO-9429795 A1 | 12/1994 |
| WO | WO-2001037090 A1 | 5/2001 |
| WO | WO-2010062655 A2 | 6/2010 |
| WO | WO-2010062655 A3 | 8/2010 |

OTHER PUBLICATIONS

"Chinese Application Serial No. 200980147989.6, Response filed Nov. 29, 2013 to Office Action dated Jul. 23, 2013", 49 pgs.

"European Application Serial No. 09829622.1, Response filed Oct. 15, 2012 to Extended Search Report dated Mar. 15, 2012", 20 pgs.

"European Application Serial No. 09829622.1, Office Action dated Mar. 15, 2012", 6 pgs.

"Japanese Application Serial No. 2011-534714, Office Action dated Dec. 3, 2013", 9 pgs.

"Chinese Application Serial No. 200980147989.6, Office Action dated Oct. 22, 2014", W/ English Translation, 5 pgs.

"European Application Serial No. 09829622.1 Response filed Feb. 12, 2015 to Examination Notification Art. 94(3) dated Oct. 7, 2014", W/ English Claims, 21 pgs.

"European Application Serial No. 09829622.1, Examination Notification Art. 94(3) dated Oct. 7, 2014", 5 pgs.

"International Application Serial No. PCT/US2009/062383, International Preliminary Report dated May 12, 2011", 10 pgs.

"Japanese Application Serial No. 2011-534714, Office Action dated Feb. 10, 2015", W/ English Translation, 4 pgs.

"Taiwanese Application Serial No. 098135465, Office Action dated Nov. 10, 2014", W/ English Translation, 28 pgs.

"Korean Application Serial No. 10-2011-7011908, Office Action dated Jan. 8, 2016", 12 pgs.

"Japanese Application Serial No. 2015-115409, Office Action dated Aug. 9, 2016", W/ English Translation, 6 pgs.

"Japanese Application Serial No. 2015-115409, Response filed Feb. 9, 2016 to Office Action dated Dec. 27, 2016", W/ English Translation of Claims, 10 pgs.

"European Application Serial No. 09829622.1, Communication Pursuant to Article 94(3) EPC dated Oct. 13, 2017", 4 pgs.

ly, each of memory units 110 through 114 may include three
ERROR CORRECTION IN MULTIPLE SEMICONDUCTOR MEMORY UNITS

PRIORITY APPLICATION

This application is a continuation of U.S. application Ser. No. 12/259,949, filed Oct. 28, 2008, which is incorporated herein by reference in its entirety.

BACKGROUND

Memory devices are widely used in computers and other electronic products such as televisions, digital cameras, and cellular phones. Some conventional memory devices may include semiconductor material having numerous memory cells to store data and other information. Some of these devices may have a capability to detect errors and correct corrupted data using various conventional techniques. Some conventional memory devices may include an organization of multiple individual semiconductor memory units to increase storage capacity. However, multiple individual semiconductor memory units may pose a challenge to some conventional error detection and correction techniques.

DETAILED DESCRIPTION

Figure 1:
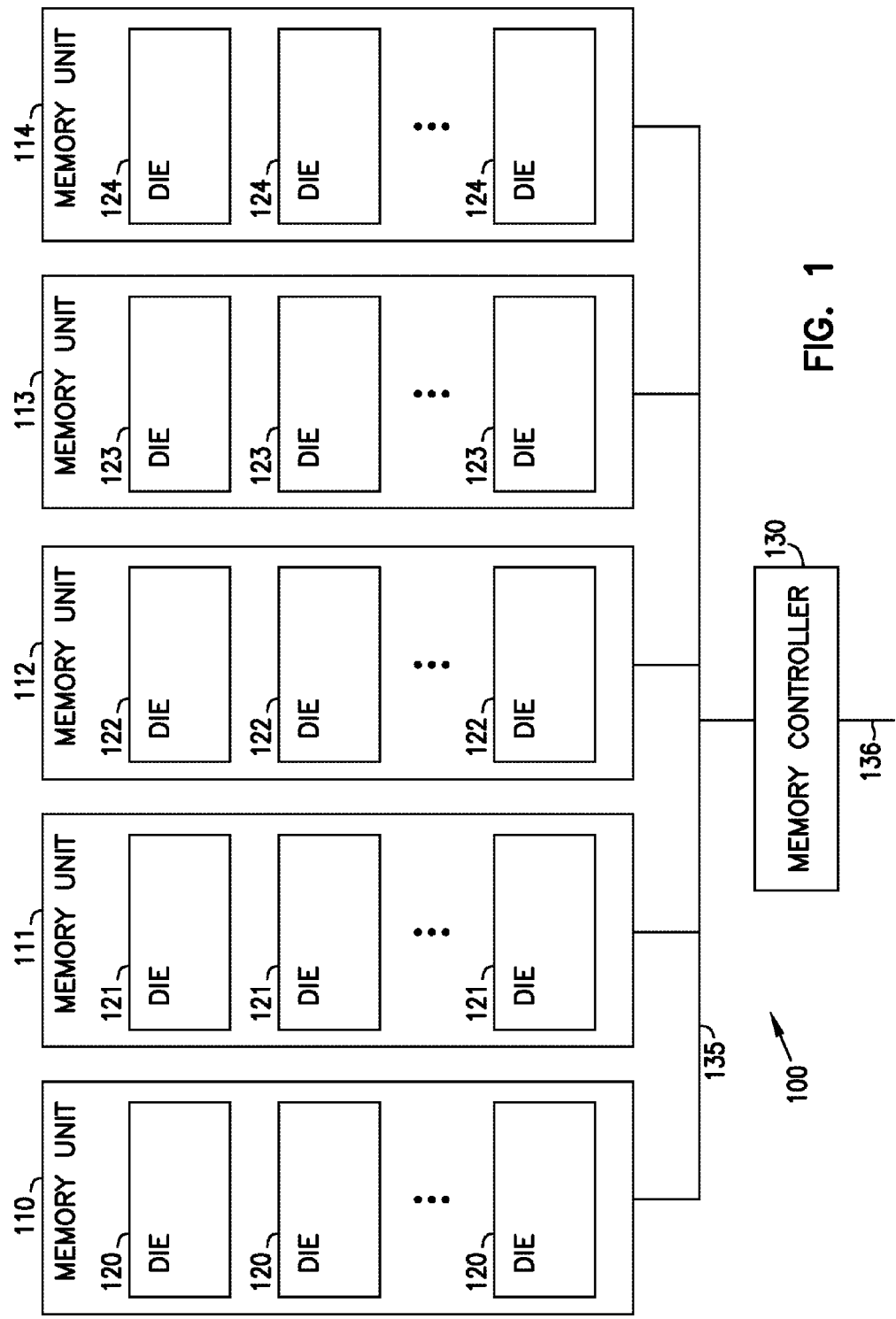
FIG. 1 is a block diagram of an apparatus including semiconductor memory units, according to various embodiments of the invention.

FIG. 1 is a block diagram of an apparatus 100 including semiconductor memory units 110, 111, 112, 113, and 114, according to various embodiments of the invention. Apparatus 100 may include, or be included in, a memory device, a processor assembly, a computer, or other electric device or system.

Memory units 110 through 114 may include the same number of memory components, e.g., dice. For example, each of memory units 110 through 114 may include three corresponding memory components, e.g., three dice 120, 121, 122, 123, or 124. FIG. 1 shows an example where apparatus 100 includes five memory units 110 through 114 and three memory components (e.g., dice). However, the number of memory units and/or the number of memory components in each memory unit may vary. For example, each of memory units 110 through 114 may include only a single memory component, e.g., a single die.

In FIG. 1, each of dice 120, 121, 122, 123, and 124 may include semiconductor material where electrical components such as memory cells and associated circuitry are formed. Apparatus 100 may store data and other information in memory units 110 through 114. Each time apparatus 100 stores data in memory units 110 through 114, it may also store associated error correction information. Apparatus 100 may use the error correction information to recover data in memory units 110 through 113 if an error occurs in that data. Apparatus 100 may use only one memory unit (e.g., unit 114) among memory units 110 through 114 to store error correction information associated data stored in all other memory units (e.g., units 110, 111, 112, and 113). In an alternative method, apparatus 100 use all memory units 110 through 114 to store error correction information associated with data stored in these memory units. However, in this alternative method, data and error correction information associated with that data are stored in separate memory components, e.g., separate dice.

Apparatus 100 may also include a memory controller 130 and a path 135 to transfer data and information to and from memory units 110 through 114. Memory controller 130 may also include a path 136 to communicate with another external device, such as a processor in a computer or in other electronic products.

Each of memory controller 130 and memory units 110 through 114 may be packaged in a separate IC package (or IC chip). The dice in each of memory units 110 through 114 may be arranged in a stack inside the IC package.

Each of memory units 110 through 114 may include its own local controller and error detection and correction components to detect and correct error that may occur in the data stored in its dice. Each memory unit may detect and correct errors occurring in the data, using techniques that may involve error correction codes (ECC) such as Hamming codes, Reed-Solomon codes, or other codes or techniques. Each of memory units 110 through 114 may also include an option of detecting errors using its own detection and correction components but may elect to allow memory controller 130 to correct the detected errors. For example, the memory unit having the error may notify memory controller 130 of the error so that memory controller 130 may perform a data recovery operation to recover the data that has the error.

FIG. 1 shows each of paths 135 and 136 using a single line for simplicity. Each of paths 135 and 136, however, may include many physical conductive lines. The conductive lines may be divided into separate groups. Memory controller 130 may be coupled to each of memory units 110 through 114 through a separate group of conductive lines (e.g., data bus) to transfer data and another separate group of lines (e.g., address and control bus) to transfer addresses and other information to and from memory controller 130. Alternatively, memory units 110 through 114 may share one or more groups of lines to transfer data, addresses, and other information between each memory unit and memory controller 130.

Apparatus 100 may include components and may be arranged to perform activities similar to or identical to those described below with reference to FIG. 2 through FIG. 9.

Figure 2:
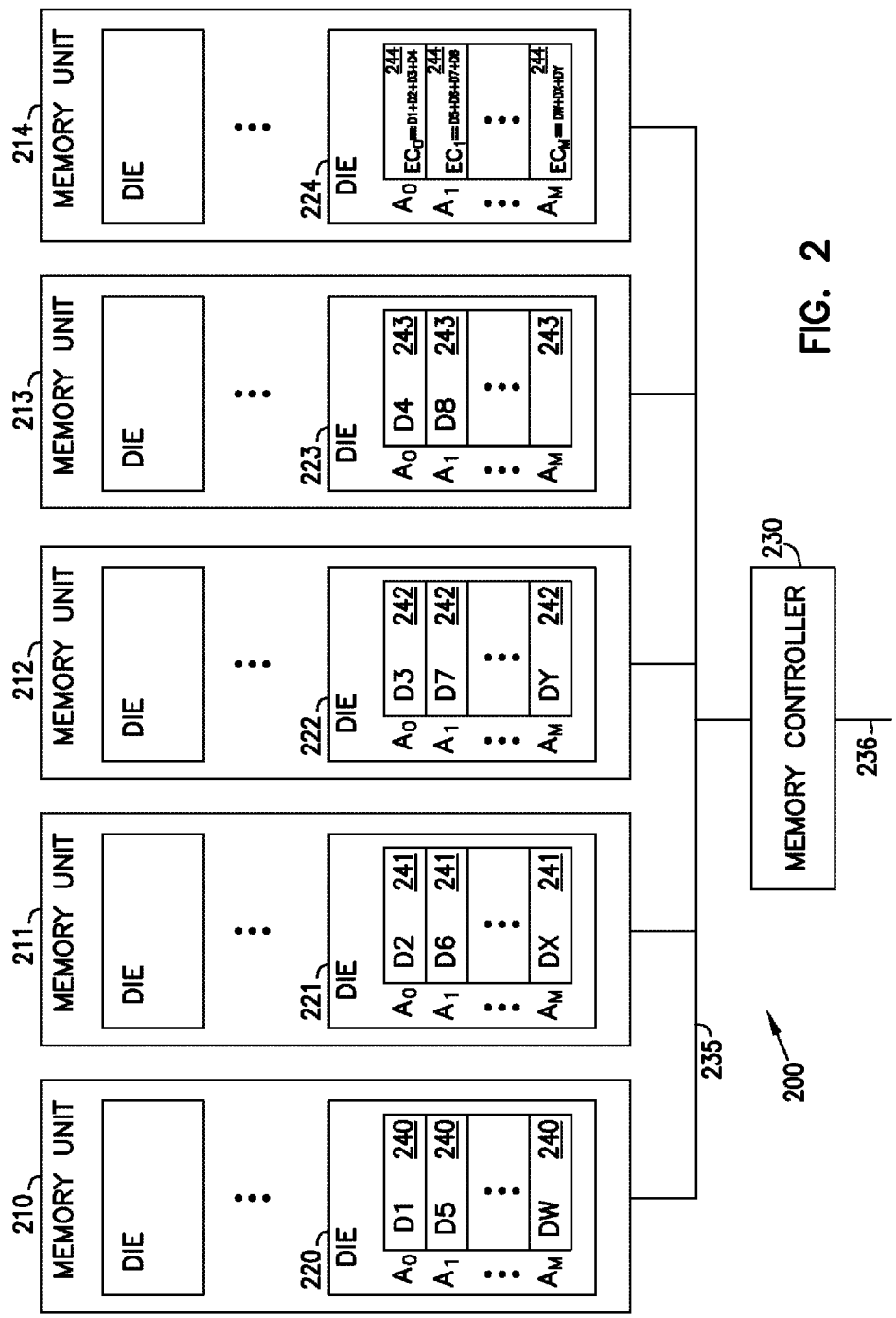
FIG. 2 is a block diagram of an apparatus including semiconductor memory units with error correction information stored in one of the memory units, according to various embodiments of the invention.

FIG. 2 is a block diagram of an apparatus 200 including semiconductor memory units 210, 211, 212, 213, and 214 with error correction information stored in one of the memory units, according to various embodiments of the invention. Memory units 210 through 214 may include corresponding dice 220, 221, 222, 223, and 224. Each die may include many memory locations, such as memory locations 240 in die 220, memory locations 241 in die 221, memory locations 242 in die 222, memory locations 243 in die 223, and memory locations 244 in die 224. Each of these memory locations may include multiple cells to store data, such as data D1, D2, D3, D4, D5, D6, D7, D8, DW, DX, and DY, and error correction information (EC), such as $EC_0$, $EC_1$, and $EC_M$.

As shown in FIG. 2, apparatus 200 may store error correction information $EC_0$ through $EC_M$ in only memory unit 214 and store data in the other memory units 210 through 213. FIG. 2 shows $EC_0$=D1+D2+D3+D4, $EC_1$=D5+D6+D7+D8, and $EC_M$=DW+DX+DY to indicate that the value of error correction information stored in a memory location in memory unit 214 is equal to the sum of data store in corresponding memory locations the other memory units 210 through 213. Thus, if N represents the number of memory units (e.g., units 210 through 213) that are used to store data, then apparatus 200 may include N+1 memory units to store both data and error correction information. FIG. 2 shows an example of N=4 memory units to store data and one memory unit to store error correction information. Thus, the total number of the memory units (M) to store both data and error correction information is M=N+1=5 in the example shown in FIG. 2.

In some embodiments, N is equal to any power of two, such that $N=2^X$, where X is an integer equal to at least one (X=1, 2, 3, or other integer greater than one). X may also be zero such that $N=2^0=1$. Thus, in some embodiments, N=1. Since the total number of the memory units is M=N+1, M may have a value of two (M=N+1=1+1=2) when N is one, or M may have a value of greater than two when N is at least two. In other embodiments, N may be an integer that is may not be a power of two. However, in a memory apparatus such as apparatus 100 (FIG. 1), 200 (FIG. 2), or other apparatus described herein, organizing memory units and/or addressing of memory locations the memory units may be relatively simpler when N is equal to a power of two than when is not a power of two.

If N is a number of the memory units to store data in an apparatus, e.g., apparatus 200, then adding only one extra memory unit to N memory units allows apparatus 200 to have a relatively small size and a relatively inexpensive way to achieve the techniques described herein including data recovering technique.

Each memory location 240, 241, 242, 243, or 244 may include one or more memory cells to store one or more bits of data. Thus, each of data D1, D2, D3, D4, D5, D6, D7, D8, DW, DX, and DY may include one or more data bits. The data and the error correction information may have the same number of bits. For example, if each of data D1, D2, D3, D4, and D5 has 64 bits, then $EC_0$ may also have 64 bits. Alternatively, the data and the error correction information may have different numbers of bits.

As shown in FIG. 2, memory locations 240 through 244 may be associated with corresponding addresses $A_0$ and $A_1$ through $A_M$. Each of address $A_0$ and $A_1$ through $A_M$ has a unique address value such that value $A_0$ is different from value $A_1$ and value $A_M$. A complete address in apparatus 200 may include memory unit number and die number in addition to the address associated with each memory location. Thus, a data item may be at address $A_0$ die 221 in memory unit 211. Apparatus 200 may store the error correction information and each data of the corresponding sum in separate dice among the memory units at memory locations with the same address value within each of the separate dice. For example, as shown in FIG. 2, error correction information $EC_0$ in memory location 244 associated with address $A_0$ has a value equal to the sum of the values of data D1, D2, D3, and D4 stored at the same address $A_0$ in dice 220, 221, 222, and 223. FIG. 2 shows an address (e.g., $A_0$) associated with a corresponding memory location in a particular die (e.g., die 220) in a memory unit, as an example. The address, however, may be associated with a corresponding memory location in any die within the memory unit. The data may be stored at a location with any address as long as all references to a particular address always reference the same data item. For example, a reference to address $A_0$ of die 221 in memory unit 211 may actually be stored at a location with address in $A_M$ of die 222 in memory unit 212 as long as all references are consistent and all read operations reference the respective data that was stored at each address. In this example, either $A_M$ of die 222 in memory unit 212 cannot be referenced or that address is mapped to somewhere else.

FIG. 2 shows an example where a particular memory location in one of memory units 210, 211, 212, and 213, e.g., memory location 243 associated with address $A_M$ in die 223, may not have stored data, e.g., empty. Thus, the corresponding error correction information, e.g., $EC_M$=DW+DX+DY, may have a value that does not include the value of the data in that particular memory location. An "empty" memory location, such as memory location 243 in FIG. 2, may contain a specific known value that is used when the associated error correction information is updated, as memory locations may be given initial values. Apparatus 200 may initialize (e.g., during system power-up) all memory locations in memory units 210, 211, 212, and 213, including memory locations that are used to store error correction information, with the same initial value, e.g., zeros or some other values. Thus, an empty memory location, such as memory location 243 in FIG. 2, may have an initial value of zero.

Each time apparatus 200 stores data in die 220, 221, 222, and 223, it may also update corresponding error correction information in die 224. If an error occurs in any one of the data D1, D2, D3, and D4, apparatus 200 may use the corresponding error correction information to recover the data that has the error. For example, if an error occurs in data D1 when it is retrieved (e.g., read), apparatus 200 may retrieve the corresponding error correction information $EC_0$ and subtract the values of data D2, D3, and D4 from the value of $EC_0$ to recover the original data D1. In this example, D1=$EC_0$−(D2+D3+D4)=(D1+D2+D3+D4)−(D2+D3+D4).

Thus, when an error occurs in a particular data stored at a particular memory location in one die of a memory unit, when that particular data is retrieved, apparatus 200 may also retrieve the data from the other memory units at memory locations with the same address value within a die of each of the other memory units. Then, apparatus 200 may perform an operation, such as a subtraction, to recover the value of the particular data that has the error.

As shown in FIG. 2, apparatus 200 may include a memory controller 230 to transfer data and information to and from memory units 210 through 214 through path 235 during various operations. Memory controller 230 may also include a path 236 to communicate with another external device, such as a processor in a computer or in other electronic products. Apparatus 200 may include a write operation to store data in memory units 210 through 214 and a read operation to retrieve the stored data.

The following description describes an example write operation to store data D1, D2, D3, and D4 and error correction information $EC_0$=D1+D2+D3+D4. This example assumes that memory location 240 through 244 associated with address $A_0$ initially has no data such that values of data in memory locations associated with address $A_0$ are equivalent to zero. In this example, memory controller 230 may transfer address $A_0$ and data D1 to die 220. Die 220 may store data D1 in memory location 240 associated with address $A_0$ and provide update information (UPDATE). In this case, UPDATE=D1−0=D1. UPDATE represents a difference in values between the value of a new data (e.g., D1 in this example) to be written to a particular memory location and a value of a previous data (e.g., "0" in this example) in that particular memory location before the new data is written. After the value of UPDATE is obtained, memory controller 230 may transfer the update information to die 224, which may update the corresponding error correction information $EC_0$ at memory location 244 associated with address $A_0$. Apparatus 200 may initialize $EC_0$ with an initial value, such as zero ($EC_0$=0) in this example. To update $EC_0$, die 224 may add the value of UPDATE=D1 to the value of $EC_0$. Thus, after data D1 is stored in die 220, $EC_0$=0+D1=D1 is stored in die 224.

Apparatus 200 may include similar activities to store data D2, D3, and D4. For example, memory controller 230 may transfer address $A_0$ and data D2 to die 221, which may store data D2 to memory location 241 associated with address $A_0$. Die 221 may also provide update information UPDATE=D2−0 when it stores data D2. Die 224 may update $EC_0$ at memory location 244 associated with address $A_0$ by adding the value of UPDATE=D2 to the value of $EC_0$. Thus, after data D2 is stored in die 221, $EC_0$=D1+D2 is stored in die 224. Similarly, $EC_0$=D1+D2+D3 is stored in die 224 after data D3 is stored in die 222, and $EC_0$=D1+D2+D3+D4 is stored in die 224 after data D4 is stored in die 223. Apparatus 200 may transfer data, such as D1, D2, D3, and D4, to memory units 210 and 213 one at a time. Alternatively, apparatus 200 may transfer two or more of the data D1, D2, D3, and D4 in parallel to memory unit 210 through 213. Thus, apparatus 200 may store data D1, D2, D3, and D4 one at a time in the corresponding memory location, or store data D1, D2, D3, and D4 two or more at a time in parallel in the corresponding memory locations.

Apparatus 200 may include components to perform the addition function (e.g., D1+D2+D3+D4) when it updates the error correction information. For example, apparatus 200 may include components to perform a logical operation equivalent to the addition function, such as a bit-wise exclusive-OR operation to the bits of data D1, D2, D3, and D4, to obtain the value for $EC_0$. Thus, $EC_0$ may have a value equal to the result of D1(+)D2(+)D3(+)D4, where (+) means "exclusive-OR" in logic terminology. In FIG. 2, the components of apparatus 200 that perform the logical operation may include a portion of memory controller 230 or the entire memory controller 230 and/or at least a portion of one or more of memory units 210 through 214. The components may include hardware circuitry (such as logic gates), software, or both. The description herein uses an exclusive-OR operation as an example to perform functions such as addition or subtraction. However, one skilled in the art may recognize that other equivalent operations, besides the exclusive-OR operation, may be used to perform the addition and subtraction functions.

The following description describes an example where apparatus 200 may perform a recovery operation to recover the original data D1 after an error occurring in data D1 is discovered. In this example, memory controller 230 may receive a notification indicating that data D1 has an error. For example, memory unit 210 may discover an error, using its own error detection components, when it reads data D1 based on a read request from memory controller 230 or based on another request. Memory unit 210 may send memory controller 230 the notification indicating the error. After receiving the notification, memory controller 230 may retrieve the corresponding error correction information associated with data D1 to perform a recovery operation. In this example, based on address $A_0$, which is the address associated with the memory location that stores data D1, memory controller 230 may retrieve the error correction information $EC_0$ from die 224 in a memory location associated with the same address $A_0$. Memory controller 230 may also retrieve other data from memory locations associated with address $A_0$ in each of other dice 221, 222, and 223. After retrieving data D2, D3, and D4, apparatus 200 may subtract the values of data D2, D3, and D4 from the value of $EC_0$=D1+D2+D3+D4 to recover the original data D1, such that D1=$EC_0$−(D2+D3+D4).

Apparatus 200 may include components to perform an operation to obtain D1=$EC_0$−(D2+D3+D4). For example, apparatus 200 may include components to perform a logical operation equivalent to the subtraction function, such as a bit-wise exclusive-OR operation $EC_0$(+)D2(+)D3(+)D4 to the bits of $EC_0$ and D2, D3, and D4 to obtain the original data D1.

As described above, apparatus 200 may initialize memory locations that are used to store data and error correction information to the same initial value, e.g., zeros. Thus, the addition function to store $EC_0$ can be written as $EC_0$=$EC_0$+D1+D2+D3+D4 (when $EC_0$ is initially equal to zero). When data, such as D1, is to be recovered, the subtraction function to recover D1 can be written as D1=$EC_0$−0−D2−D3−D4, where "0" indicates that the value of D1 (error data value) is not counted in the equation. Since the bit-wise addition and subtraction are the same (same exclusive-OR operations), $EC_0$+D1+D2+D3+D4 is the same as $EC_0$−0−D2−D3−D4, with the value of D1 being blocked (or set to be "0" during data recovery). Thus, the same implementation may be used in both the addition function to store error correction information and the subtraction function to recover data.

For example, in the above description, the bit-wise exclusive-OR operation D1(+)D2(+)D3(+)D4 to perform an addition function $EC_0$=$EC_0$+D1+D2+D3+D4 (when $EC_0$ is initially equal to zero) may be referred to as a first bit-wise exclusive-OR operation. The bit-wise exclusive-OR operation $EC_0$(+)D2(+)D3(+)D4 to perform a subtraction operation D1=$EC_0$−0−D2−D3−D4 to recover D1 may be referred to as a second bit-wise exclusive-OR operation. In comparing the first and second bit-wise exclusive-OR operations, the value of data D1 in the first bit-wise exclusive-OR operation is replaced by the value of $EC_0$ in the second bit-wise exclusive-OR operation. Thus, apparatus 200 may use the same components to perform both the first and second bit-wise exclusive-OR operations with some changes. For example, memory units 210 through 214 may include common paths to transfer data and error correction information to the components (e.g., logic circuitry) that perform a bit-wise exclusive-OR operation. However, apparatus 200 may also include elements (e.g., switches such as transistors) that can be switched from one position during the first bit-wise exclusive-OR operation to another position during the second bit-wise exclusive-OR operation to block the transfer of data D1 to the components that perform the operation and replace the transfer of data D1 with the transfer of $EC_0$.

Apparatus 200 may include similar activities to recover the original data D2, D3, or D4 if an error occurs in one of these data. For example, apparatus 200 may subtract the values of D1, D3, and D4 from the value of $EC_0$=D1+D2+D3+D4 to recover the original data D2 if an error occurs in data D2.

The above description with reference to FIG. 2 assumes that the total number of the semiconductor memory units (M=N+1) to store both data and error correction information is greater than two (M>2), meaning that N is equal to or greater than two. Thus, as described above, the error correction information may have a value equal to a sum of more than two data values, e.g., $EC_0$=D1+D2+D3+D4. However, in embodiments where the total number of the memory units is two (M=N+1=2), one of the two units may be used to store only error correction information associated with data stored in the other unit of the two units. In these embodiments (M=N+1=2), the error correction information and the data would have an equal value. For example, if M=N+1=2 such that apparatus 200 of FIG. 2 includes only memory units 210 and 214, then $EC_0$ in memory unit 214 is equal to only D1 ($EC_0$=D1) in memory unit 210. In this example, during a data recovery, D1 may be recovered by retrieving the value of $EC_0$, such that D1=$EC_0$. In this same example, $EC_M$ in memory unit 214 is equal to only DW ($EC_M$=DW) in memory unit 210. During a data recovery, DW may be recovered by retrieving the value of $EC_M$, such that DW=$EC_M$. The effect of storing the same data in two different memory units is that if the data stored in one memory unit has an error, then the data (same data) stored in the other memory unit can still be read (e.g., recovered).

Figure 3:
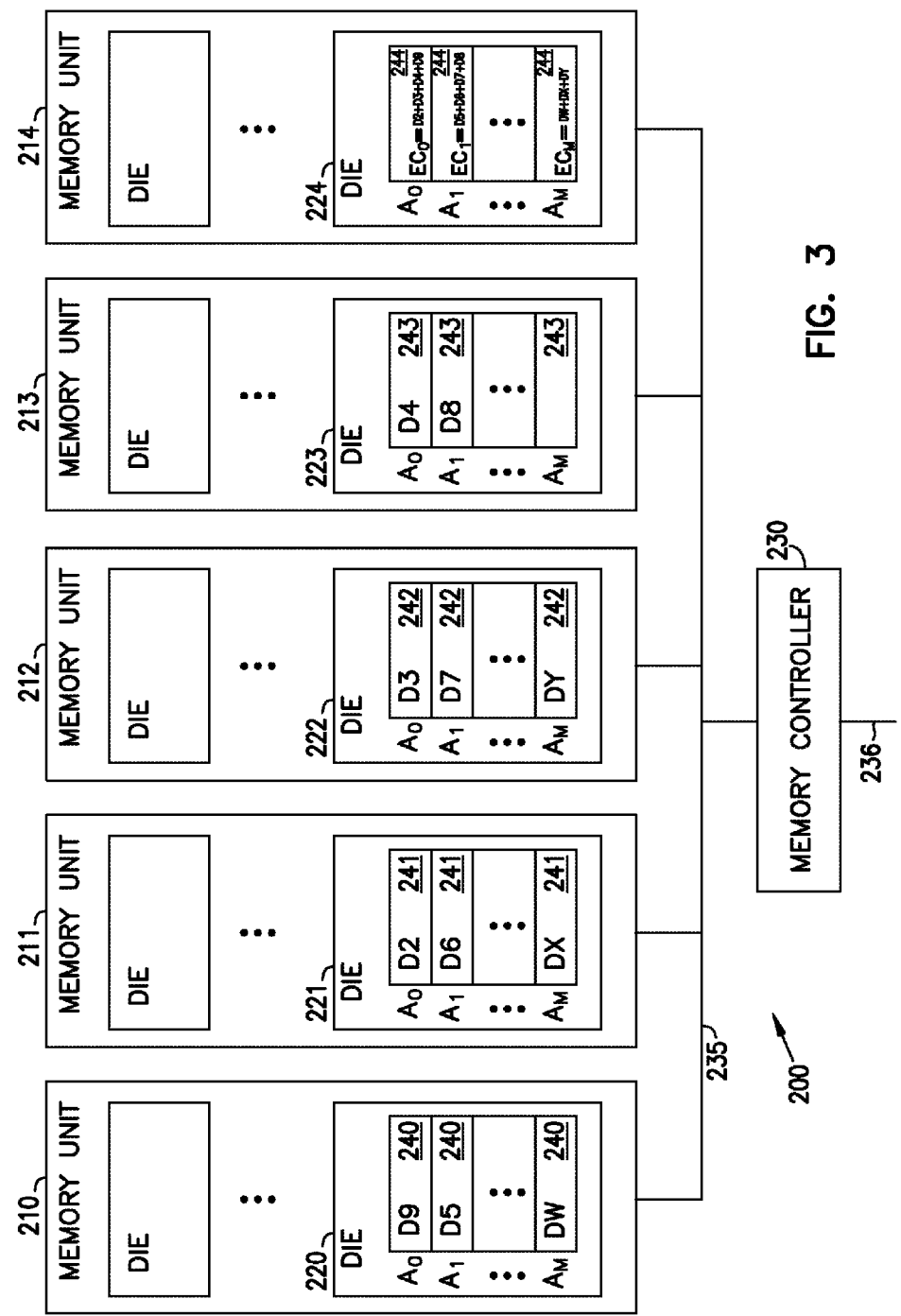
FIG. 3 is a block diagram of the apparatus of FIG. 2 with a memory location having previous data replaced by new data and having error correction information with a new value, according to various embodiments of the invention.

FIG. 3 is a block diagram of apparatus 200 showing another value of error correction information $EC_0$ at memory location 244 associated with address $A_0$ after data D9 replaces previous data D1 in memory location 240 associated with address $A_0$ in die 220. As shown in FIG. 3, $EC_0$=D2+D3+D4+D9, which is the sum of the data stored at memory locations associated with address $A_0$ in dice 220, 221, 222, and 223. Apparatus 200 may perform the following activities to update $EC_0$ so that $EC_0$=D2+D3+D4+D9 after data D9 has replaced data D1.

Before data D9 is stored, $EC_0$=D1+D3+D4+D4 as shown in FIG. 2. When die 220 receives data D9 to be stored in memory location 240 as associated with address $A_0$, it may retrieve data D1 and then store data D9 after data D1 is retrieved. Apparatus 200 may use data D1 to obtain a value for update information UPDATE to update $EC_0$. In this example, UPDATE=D9−D1, which is a difference between data D9 to be stored and the previous data D1.

During the update of $EC_0$, apparatus 200 may add the value of UPDATE=D9−D1 to the value of $EC_0$. Thus, $EC_0$=$EC_0$+(D9−D1)=(D1+D2+D3+D4)+(D9−D1)=D2+D3+D4+D9. Therefore, after data D9 is stored in die 220, $EC_0$=D2+D3+D4+D9 is stored (or updated) in die 224.

Alternatively, instead of updating $EC_0$ with the difference between data D9 and data D1 (D9−D1) before data D9 is stored in die 220 as discussed above, $EC_0$ may be calculated using data D9, data D2, data D3, and data D4 after data D9 is stored in die 220.

Apparatus 200 may include components to perform logical operations such as a bit-wise exclusive-OR operation to obtain the result of UPDATE=D9−D1. For example, apparatus 200 may include components to perform a bit-wise exclusive-OR operation, D9(+)D1, to the bits of data D9 and data D1 to obtain the value for UPDATE. Thus, calculating the difference UPDATE=D9−D1 may be performed by a bit-wise exclusive-OR operation to bits of data D9 and data D1. Apparatus 200 may also include components to perform an operation to obtain $EC_0$=$EC_0$+UPDATE. For example, apparatus 200 may include components to perform a logical operation such as a bit-wise exclusive-OR operation $EC_0$(+)UPDATE to the bits of $EC_0$ and the bits of UPDATE to update $EC_0$.

The example above shows that apparatus 200 may update $EC_0$ with one transfer of information (D9−D1) to die 224 instead of two transfers of information. For example, instead of using a first transfer to send data D1 (after D1 is retrieved) to die 224 to perform an operation to obtain $EC_0$=$EC_0$−D1 (or D1+D2+D3+D4−D1=D2+D3+D4) and then using a second transfer to send data D9 to die 224 to perform $EC_0$=$EC_0$+D9=D2+D3+D4+D9, apparatus 200 may use only one transfer to send the update information (UPDATE=D9−D1) to die 224 to update $EC_0$ to achieve the same result, i.e., $EC_0$=(D1+D2+D3+D4)+(D9−D1)=D2+D3+D4+D9.

Apparatus 200 may use activities similar to the activities described above with reference to FIG. 2 to recover an original value of a particular data if an error occurs in that particular data. For example, if an error occurs in data D9, apparatus 200 may perform a recovery operation to recover the original data D9. In this example, D9=$EC_0$−(D2+D3+D4)=(D2+D3+D4+D9)−(D2+D3+D4), or D9=$EC_0$(+)D2(+)D3(+)D4.

Figure 4:
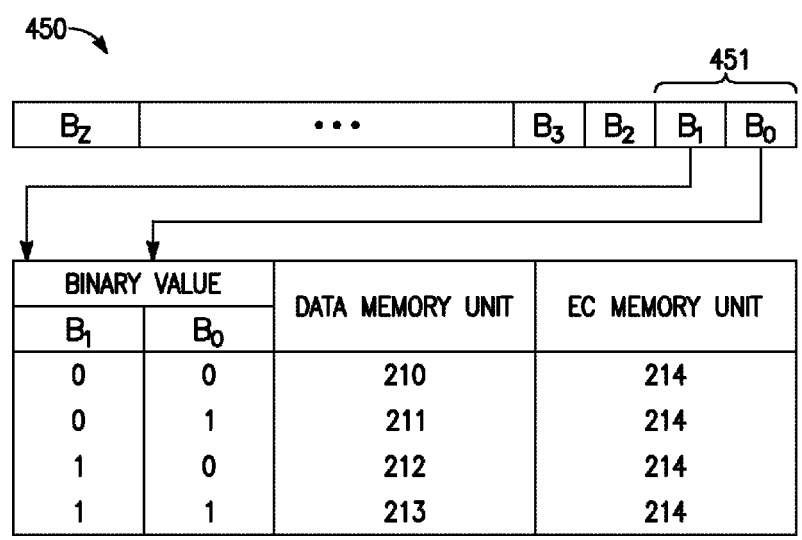
FIG. 4 is a diagram showing an example of address mapping for data and error correction information that may be used in the apparatus of FIG. 2 and FIG. 3, according to various embodiments of the invention.

FIG. 4 is a diagram showing an example of address mapping for data and error correction information that may be used in apparatus 200 of FIG. 2 and FIG. 3. FIG. 4 shows an address 450 having address bits $B_0$, $B_1$, $B_2$, and $B_3$ through $B_Z$. Apparatus 200 may use a portion 451 having bits $B_0$ and $B_1$ of address 450 to identify which unit among memory units 210, 211, 212, and 213 may be selected to store data (e.g., D1 in FIG. 2). In FIG. 4, for example, when bits $B_0$ and $B_1$ have binary value of 00, 01, 10, or 11, apparatus 200 may store data in memory unit 210, 211, 212, or 213, respectively, in memory locations based on the value of address 450. Apparatus 200 may also store error correction information in a memory location associated with the same address in memory unit 214. Because apparatus 200 may use only one memory unit to store the error correction information EC, apparatus 200 may designate one of the memory units (e.g., unit 214 as shown in FIG. 4) to store the error correction information each time it stores data in other memory units (e.g., units 210, 211, 212, and 213). Apparatus 200 may use bits $B_2$ and $B_3$ through $B_Z$ of address 450 to select the memory locations in memory units 210 through 214 to store data and error correction information.

Figure 5:
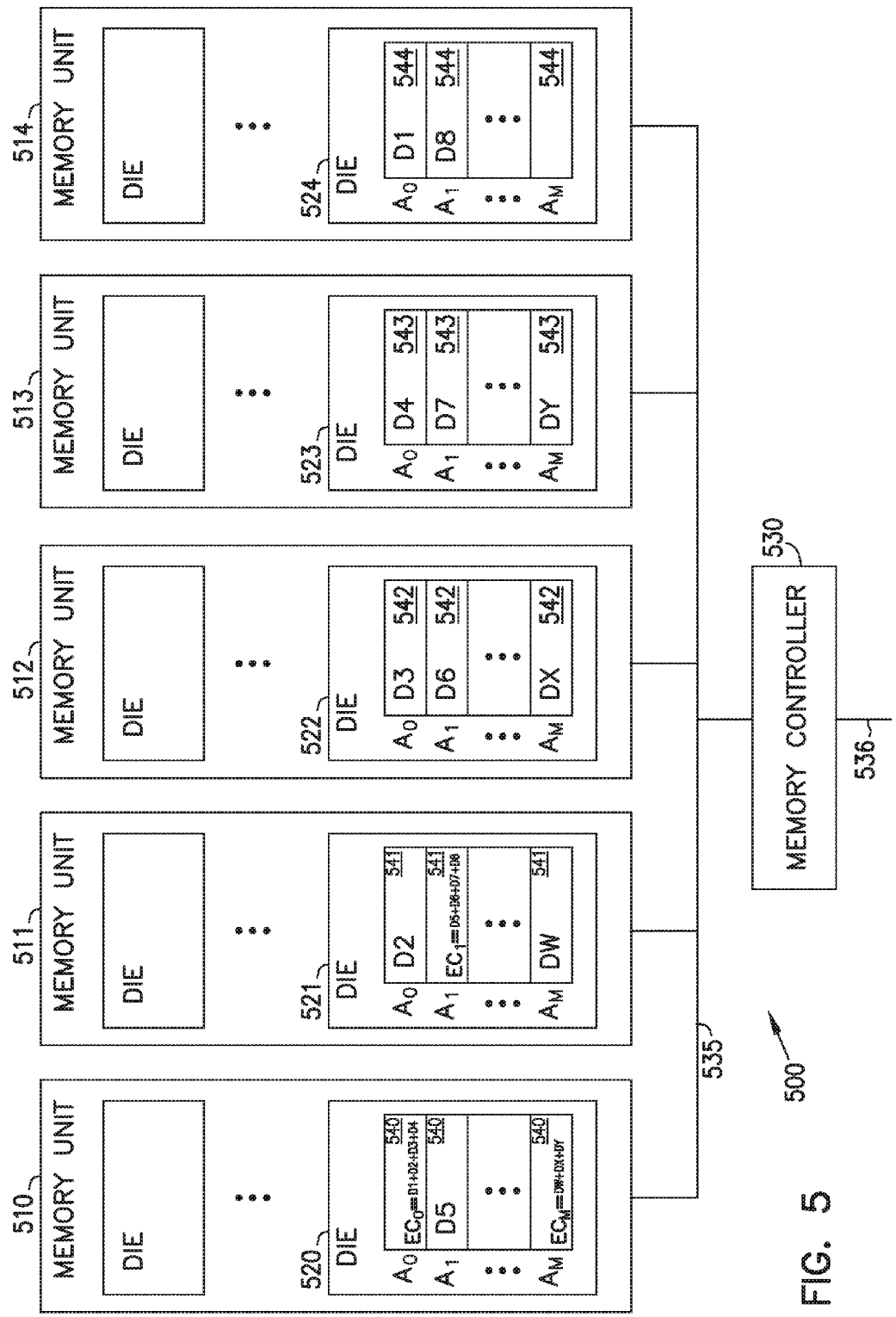
FIG. 5 is a block diagram of an apparatus including semiconductor memory units with error correction information stored in more than one memory unit, according to various embodiments of the invention.

FIG. 5 is a block diagram of an apparatus 500 including semiconductor memory units 510, 511, 512, 513, and 514 with error correction information stored in more than one memory unit, according to various embodiments of the invention. As shown in FIG. 5, apparatus 500 may store error correction information $EC_0$ and $EC_1$ through $EC_M$ in more than one of memory units 510 through 514. For example, apparatus 500 may store $EC_0=D1+D2+D3+D4$ and $EC_M=DW+DX+DY$ in die 520 of memory unit 510, and $EC_1=D5+D6+D7+D8$ in die 521 of memory unit 511. FIG. 5 shows an example where apparatus 500 stores correction information $EC_0$ through $EC_M$ in two memory units 510 and 511. However, apparatus 500 may store error correction information $EC_0$ through $EC_M$ in more than two memory units.

As shown in FIG. 5, apparatus 500 may also store data, such as data D1, D2, D3, D4, D5, D6, D7, D8, DW, DX, and DY, at various memory locations in dice 520 through 524. Apparatus 500 may also include addresses $A_0$ and $A_1$ through $A_M$ associated with corresponding memory locations in die 520 through 524. FIG. 5 shows an address (e.g., $A_0$) associated with a corresponding memory location in a particular die (e.g., die 520) in a memory unit, as an example. The address, however, may be associated with a corresponding memory location in any die within the memory unit. FIG. 5 also shows an example where a particular memory location in one of memory units 510, 511, 512, and 513, e.g., memory location 544 associated with address $A_M$ in die 524, may not have stored data, e.g., empty. Thus, the corresponding error correction information, e.g., $EC_M=DW+DX+DY$, may have a value that does not include the value of the data in that particular memory location. In some embodiments, apparatus 500 may initialize all memory locations in memory units 510 through 514 (including memory locations that are used to store error correction information) with the same initial value, e.g., zeros or some other values.

Apparatus 500 may include a memory controller 530 to transfer data and information to and from memory units 510 through 514 via path 535. Memory controller 530 may also include a path 536 to communicate with another external device, such as a processor in a computer or in other electronic products. Each time apparatus 500 stores data in a memory unit among memory units 510 through 514, apparatus 500 may also update corresponding error correction information in another memory unit. Apparatus 500 may use error correction information $EC_0$ through $EC_M$ to recover an original value of a particular data if an error occurs in that particular data. Apparatus 500 may include activities similar to or identical to the activities described above with reference to FIG. 2 and FIG. 3 to recover data.

Figure 6:
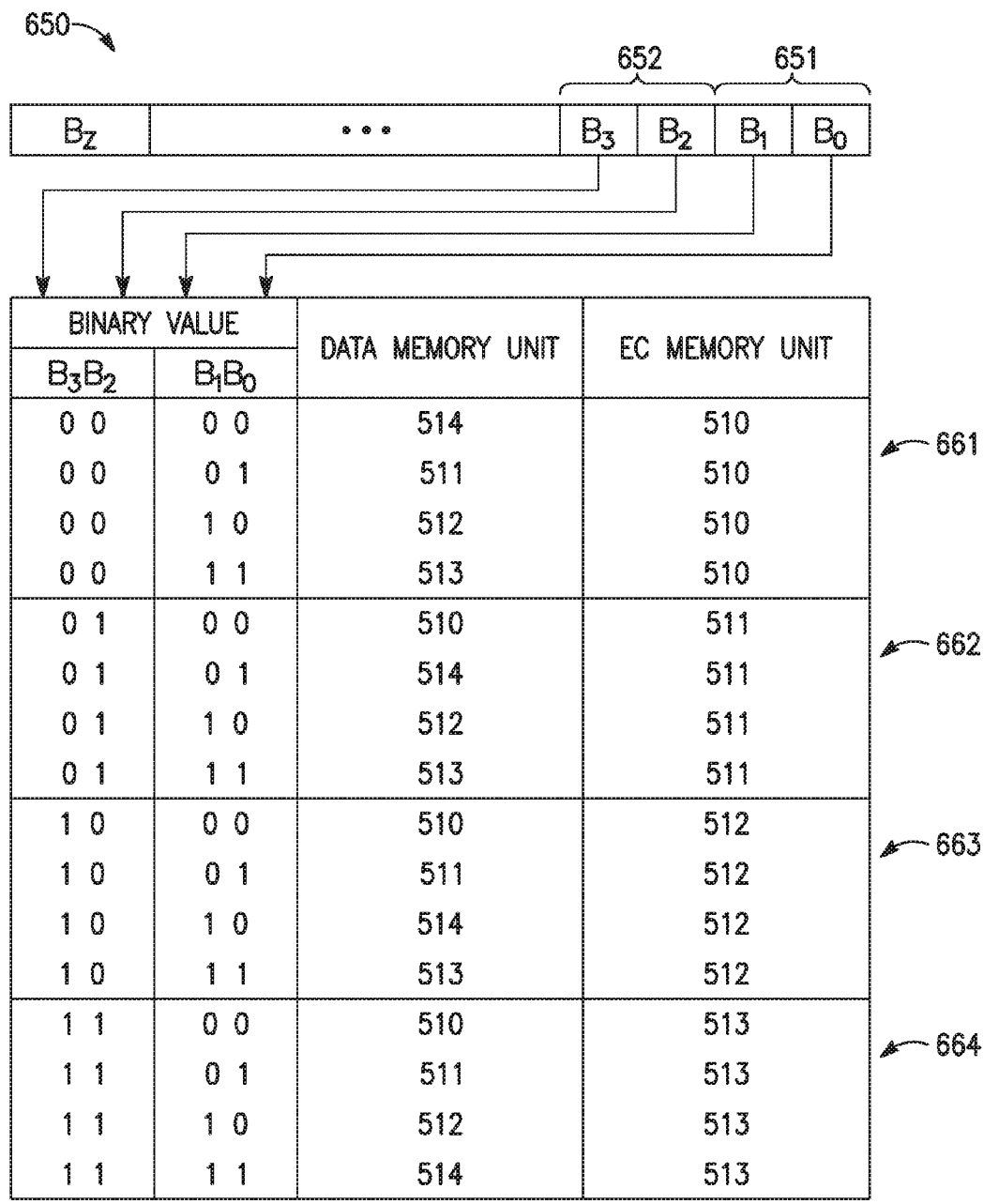
FIG. 6 is a chart showing an example of address mapping for data and error correction information that may be used in the apparatus of FIG. 5, according to various embodiments of the invention.

FIG. 6 is a chart showing an example of address mapping for data and error correction information that may be used in apparatus 500 of FIG. 5. FIG. 6 shows an address 650 having address bits $B_0$, $B_1$, $B_2$, and $B_3$ through $B_Z$. Apparatus 500 may use a portion 652 of address 650 that may include bits $B_2$ and $B_3$ to identify which unit among memory units 510, 511, 512, and 513 may be selected to store the error correction information. For example, as shown in FIG. 6, when bits $B_2$ and $B_3$ have binary value of 00, 01, 10, or 11, apparatus 500 may store the error correction information EC in memory unit 510, 511, 512, or 513, respectively.

Apparatus 500 may use a portion 651 (including bits $B_0$ and $B_1$) in combination with portion 652 (including bits $B_2$ and $B_3$) to identify which unit among memory units 510, 511, 512, and 513 may be selected to store data, depending on whether the value represented by bits $B_2$ and $B_3$ is equal to or not equal to the value represented by bits $B_0$ and $B_1$.

If the value represented by bits $B_0$ and $B_1$ is equal to the value represented by bits $B_2$ and $B_3$, then apparatus 500 may store the data in memory unit 514. As shown in FIG. 6, in rows 661, 662, 663, and 664, the value of bits $B_0$ and $B_1$ is equal to the values of bits $B_2$ and $B_3$ (00=00, 01=01, 10=10, and 11=11). Therefore, as shown in FIG. 6, memory unit 514 may be used to store data.

If the value represented by bits $B_0$ and $B_1$ is not equal to the value represented by bits $B_2$ and $B_3$, then apparatus 500 may store the data at the memory unit based on values of bits $B_0$ and $B_1$. As shown in FIG. 6, if bits $B_0$ and $B_1$ have binary value of 00, 01, 10, or 11 and are not equal to the values of bits $B_2$ and $B_3$, then apparatus 500 may store data in memory units 510, 511, 512, or 513, respectively, based on the value 00, 01, 10, or 11 of bits $B_0$ and $B_1$.

In the above description, apparatus 500 may use the value of bits $B_0$ and $B_1$ and the value of bits $B_2$ and $B_3$ to identify which unit among memory units 510, 511, 512, 513, and 514 may be selected to store data and which unit to store error correction information. Apparatus 500 may use the value of bits $B_2$ and $B_3$ through $B_Z$ of address 650 to select which memory location of the identified memory unit to store data or error correction information.

FIG. 6 shows portions 651 and 652 including bits $B_0$, $B_1$, $B_2$, and $B_3$ of address 650, as an example. Each of portions 651 and 652, however, may include different bits in different portions of address 650.

Figure 7:
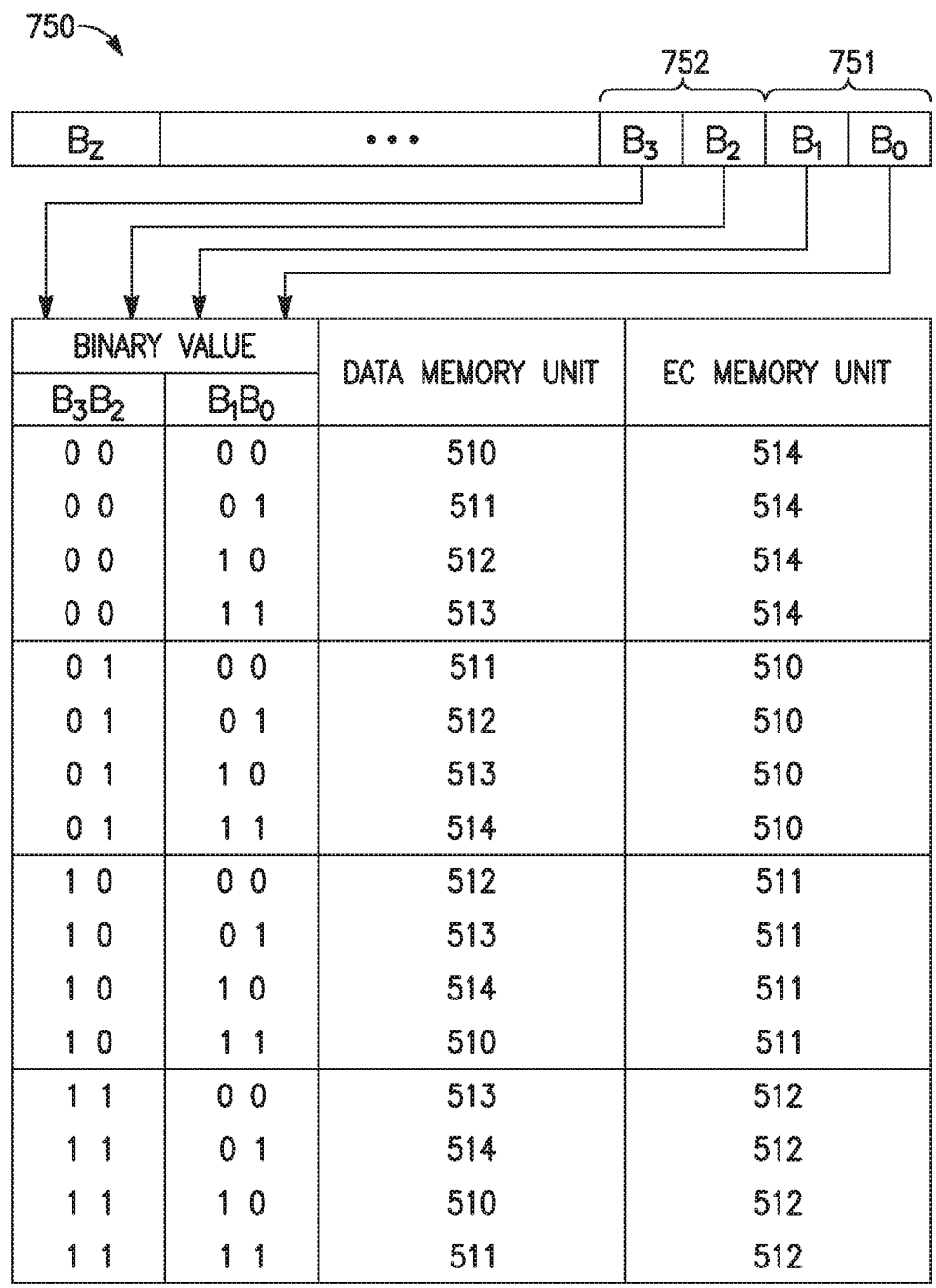
FIG. 7 is a chart showing another example of address mapping for data and error correction information that may be used in the apparatus of FIG. 5, according to various embodiments of the invention.

FIG. 7 is a chart showing another example of address mapping for data and error correction information that may be used in apparatus 500 of FIG. 5. FIG. 7 shows an address 750 having address bits $B_0$, $B_1$, $B_2$, and $B_3$ through $B_Z$.

Apparatus 500 may use a portion 752 having bits $B_2$ and $B_3$ to identify which unit among memory units 510, 511, 512, and 513 may be selected to store data or error correction information. For example, as shown in FIG. 7, when bits $B_2$ and $B_3$ have binary value of 00, 01, 10, or 11, apparatus 500 may store the error correction information in memory unit 514, 510, 511, or 512, respectively.

Apparatus 500 may use a portion 751 (including bits $B_0$ and $B_1$) in combination with portion 752 (including bits $B_2$ and $B_3$) to identify which unit among memory units 510, 511, 512, and 513 may be selected to store data. For example, as shown in FIG. 5, apparatus 500 may use the value calculated by the operation $((B_1B_0)+(B_3B_2))$ modulo N+1 to identify the memory unit that may be selected to store data, where $B_0B_1$ is the value of bits $B_0$ and $B_1$, and $B_3B_2$ is the value of bits $B_2$ and $B_3$, and N+1 is equal to the total number of memory units of apparatus 500.

In the above description, apparatus 700 may use the values of bits $B_0$ and $B_1$ and bits $B_2$ and $B_3$ to identify which unit among memory units 710, 711, 712, 713, and 714 to store data and which unit to store error correction information. Apparatus 700 may and use the value of bits $B_2$ and $B_3$ through $B_Z$ of address 650 to select which memory location of the identified memory unit to store data or error correction information.

Apparatus 500 may use bits $B_2$ and $B_3$ through $B_Z$ of address 750 to select the memory location to store the data and error correction information in memory units 510 through 514.

FIG. 7 shows portions 651 and 752 including bits $B_0$, $B_1$, $B_2$, and $B_3$ of address 750, as an example. Each of portions 751 and 752, however, may include different bits in different portions of address 750.

The above description with reference to FIG. 5 through FIG. 7 assumes that the total number of the semiconductor memory units (M=N+1) to store both data and error correction information is greater than two (M>2), meaning that N is equal to or greater than two. However, in embodiments where the total number of the memory units is two (M=N+1=2), the error correction information and the data would have an equal value. For example, if M=N+1=2 such that apparatus 500 of FIG. 5 includes only memory units 510 and 511, then $EC_0$ in memory unit 510 is equal to only D2 ($EC_0$=D2) in memory unit 511. In this example, during a data recovery, D2 may be recovered by retrieving the value of $EC_0$, such that D2=$EC_0$. In this same example, $EC_1$ in memory unit 511 is equal to only D5 ($EC_1$=D5) in memory unit 510. During a data recovery, D5 may be retrieved by retrieving the value of $EC_1$, such that D5=$EC_1$.

Further, in embodiments where the total number of the memory units in apparatus 500 of FIG. 5 is two (M=N+1=2), error correction information and data may be separately stored in the two memory units based on some predetermined condition. For example, in FIG. 5, if an address of the data (e.g., D2) to be stored satisfies a condition, then that data would be stored in one unit (e.g., unit 511) and error correction information (e.g., $EC_0$=D2) would be stored in the other unit (e.g., unit 510). The condition may be based on a value of a selected bit (or multiple bits) of the address of the data, or some other conditions. For example, in FIG. 5 (if M=2), the address of data D2 may have an even value. Therefore, D2 is stored in memory unit 511 and error correction information $EC_0$=D2 is stored in memory unit 510. In another example, in FIG. 5 (if M=2), the address of data D5 may have an odd value. Therefore, D5 is stored in memory unit 510 and error correction information EC1=D5 is stored in memory unit 511.

Figure 8:
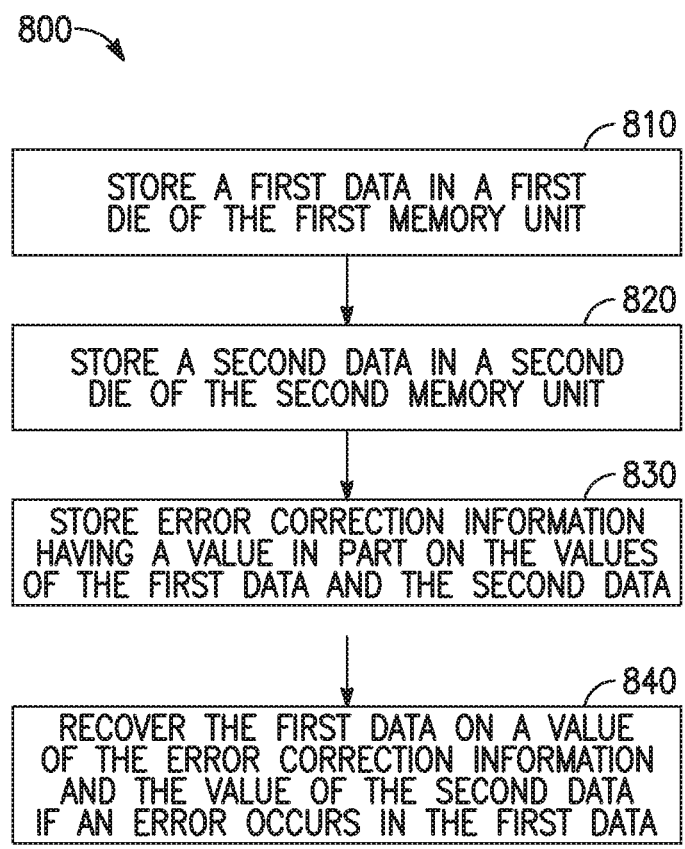
FIG. 8 is a flow diagram showing a method of operating an apparatus, according to various embodiments of the invention.

FIG. 8 is a flowchart showing a method of operating memory units, according to various embodiments of the invention. Method 800 may be used in an apparatus such as apparatus 100 of FIG. 1, apparatus 200 of FIG. 2, or apparatus 500 FIG. 5. Thus, the features of the apparatus used in method 800 may include the features of apparatus 100 of FIG. 1, apparatus 200 of FIG. 2, or apparatus 500 FIG. 5.

Activity 810 of method 800 may include storing a first data in a first die in a first memory unit. Activity 820 may include storing a second data in a second die in a second memory unit. Activity 830 may include storing error correction information having a value based in part on values of the first data and the second data. Activity 840 may include recovering the first data based on the value of the error correction information and the value of the second if an error occurs in the selected data. Method 800 may include other activities similar to or identical to the activities described above with reference to FIG. 1 through FIG. 7. Various embodiments described herein may have more or fewer activities than the activities shown in FIG. 8.

Figure 9:
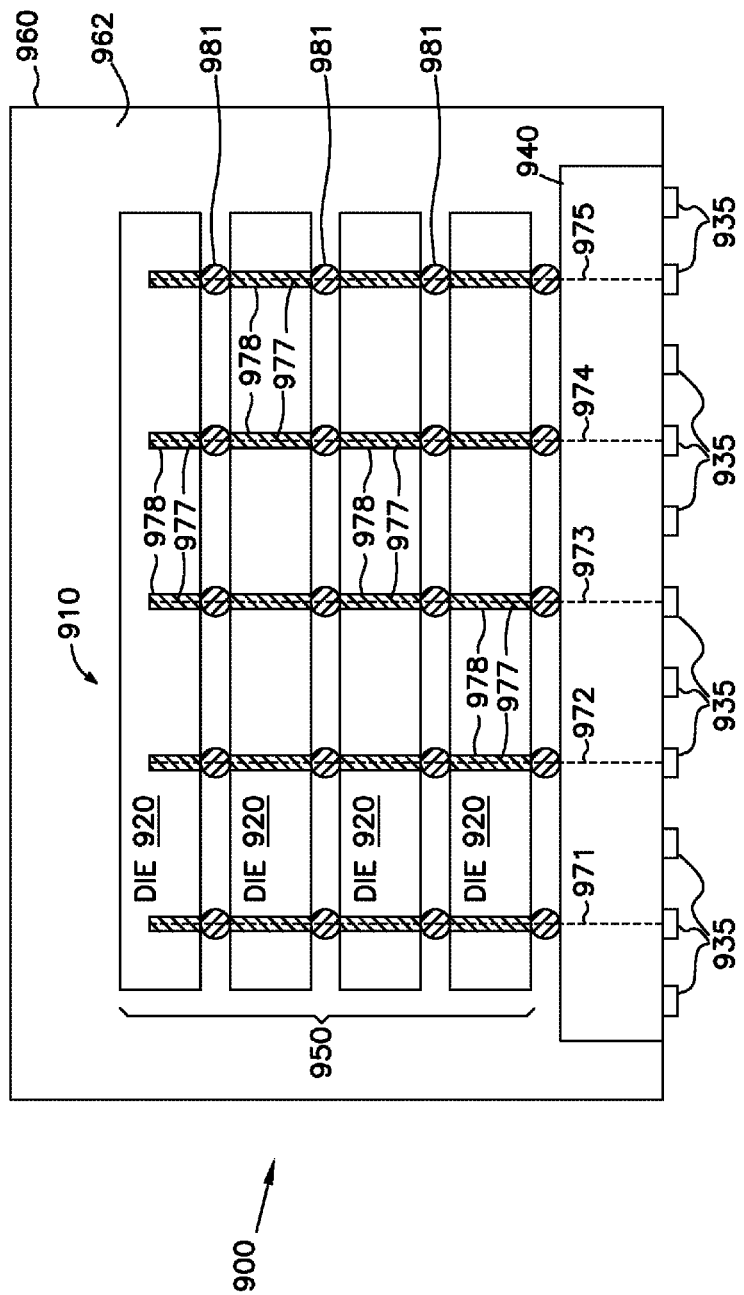
FIG. 9 shows a cross section of an integrated circuit (IC) package including a semiconductor memory unit having dice arranged in a stack, according to various embodiments of the invention.

FIG. 9 shows a partial cross section of an IC package 900 including a semiconductor memory unit 910 having dice 920 arranged in a stack 950, according to various embodiments of the invention. IC package 900 may also be called an IC chip where memory unit 910 including dice 920 are inside the IC chip 900. Memory unit 910 may include a memory unit similar to or identical to one of memory unit 110 through 114 of FIG. 1, one of memory unit 210 through 214 of FIG. 2 and FIG. 3, or one of memory unit 510 through 514 of FIG. 5. Thus, each of dice 920 in FIG. 9 may include circuitry with circuit components to store data or error correction information described above with reference to FIG. 1 through FIG. 8. For clarity, FIG. 9 omits details of circuitry and circuit components in dice 920.

IC package 900 may include a support 940 coupled to memory unit 910. Support 940 may include a ceramic or organic package substrate. Contacts 935 may be coupled to support 940 to enable memory unit 910 to communicate with another devices such as a memory controller similar to or identical to memory controller 130, 230, and 530 of FIG. 1, FIG. 3, and FIG. 5, respectively. In FIG. 9, IC package 900 may include an enclosure 960, which may enclose at least a portion of support 940 and memory unit 910 in interior 962. Interior 962 may be filled with a filling material, a gas, a liquid, or a combination thereof. The filling material may include a polymer material.

As shown in FIG. 9, memory unit 910 may include a number of conductive paths 971, 972, 973, 974, and 975 going through dice 920. Each of conductive paths 971 to 975 may include conductive material 977 inside via 978 that extend at least partly or entirely through each of dice 920. Conductive paths 971 to 975 may include joints 981 formed between dice 920. Joints 981 may include solder, copper, or a conductive adhesive. Memory unit 910 may be formed using techniques such as "flip-chip" or other techniques.

Figure 10:
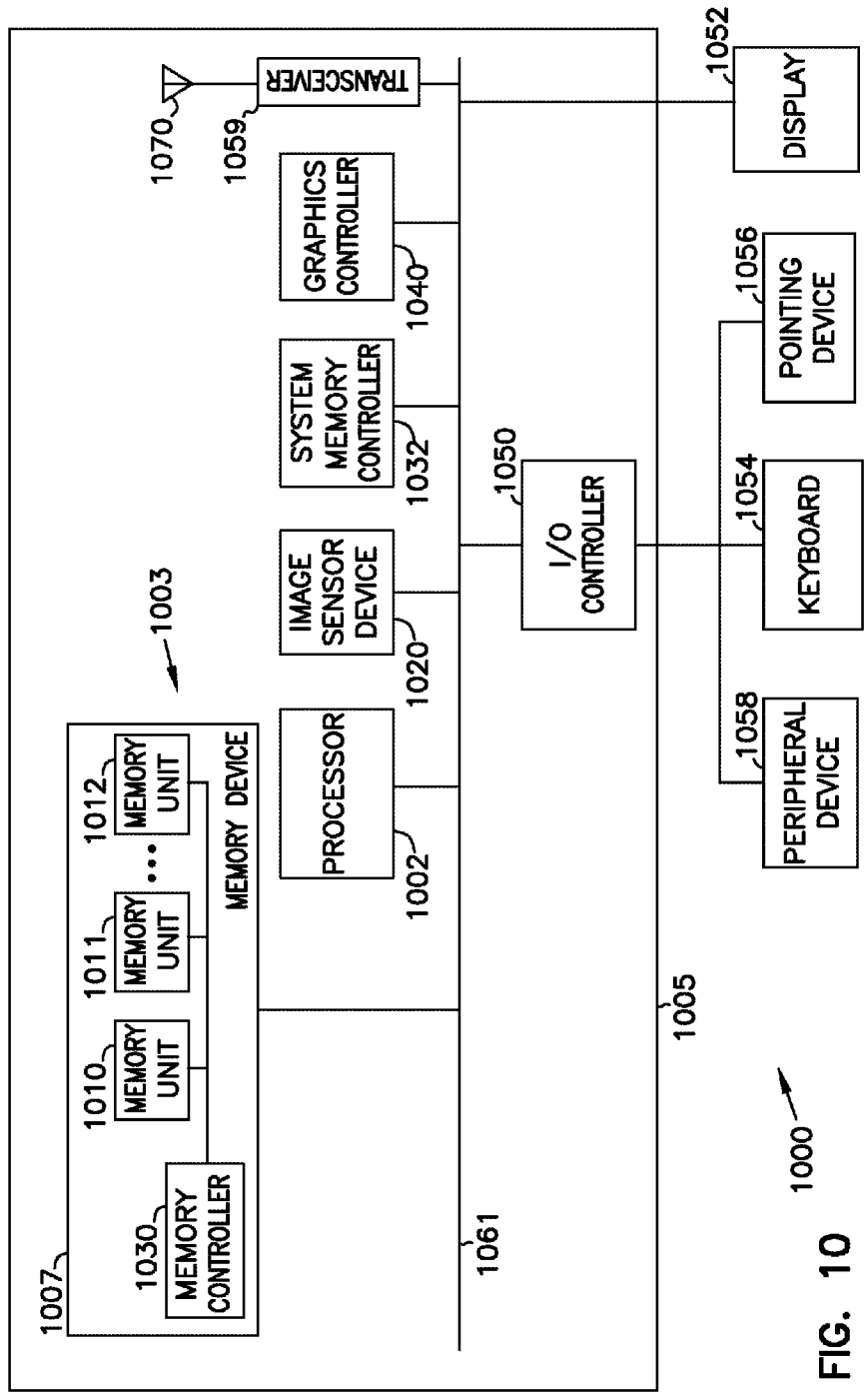
FIG. 10 shows a system, according to various embodiments of the invention.

FIG. 10 shows a system 1000, according to various embodiments of the invention. System 1000 may include a processor 1002, a memory device 1003, an image sensor device 1020, a system memory controller 1032, a graphics controller 1040, an input and output (I/O) controller 1050, a display 1052, a keyboard 1054, a pointing device 1056, a peripheral device 1058, a system transceiver 1059, and antenna 1070 to wirelessly transmit and receive information to and from system 1000, a bus 1061 to transfer information among the components of system 1000, and a circuit board 1005 (e.g., motherboard) where some of the components of system 1000 may be attached. System 1000 may omit some of the components shown in FIG. 10.

Processor 1002 may include a general-purpose processor, an application specific integrated circuit (ASIC), or other types of processors. Processor 1002 may include a single core processor or a multi-core processor. Processor 1002 may execute one or more programming commands to process information. The information may include information provided by other components of system 1000 such as memory device 1003 or image sensor device 1020. Image sensor device 1020 may include a complementary metal-oxide-semiconductor (CMOS) image sensor having a CMOS pixel array or charge-coupled device (CCD) image sensor having a CCD pixel array.

Memory device 1003 may include various embodiments of apparatus 100 of FIG. 1, apparatus 200 of FIG. 2 or FIG. 3, and apparatus 500 of FIG. 5. For example, memory device 1003 may include memory units 1010, 1011, and 1012 and a device memory controller 1030. Each of memory units 1010, 1011, and 1012 may be enclosed in a separate IC package such as IC package 900 of FIG. 9. FIG. 10 shows memory device 1003 having three memory units 1010, 1011, and 1012 as an example. However, the number of memory units of memory device 1003 may vary. FIG. 10 shows an example where memory controller 1030 and memory units 1010, 1011, and 1012 are located in the same board 1007 (e.g., a board of a dual in-line memory module "DIMM"). However, memory controller 1030 and memory units 1010, 1011, and 1012 may be located in different boards, such as in board 1007 and in circuit board 1005, or may be scattered in different locations in system 1000.

Memory device 1003 may include a volatile memory device, a non-volatile memory device, or a combination of both. For example, memory device 1003 may include a dynamic random access memory (DRAM) device, a static random access memory (SRAM) device, a flash memory device, phase change memory device, or a combination of these memory devices.

The illustrations of apparatus (e.g., apparatuses 100, 200, and 500) and systems (e.g., system 1000) are intended to provide a general understanding of the structure of various embodiments and are not intended to provide a complete description of all the components and features of apparatus and systems that might make use of the structures described herein.

Any of the components described above can be implemented in a number of ways, including simulation via software. Thus, (e.g., apparatuses 100, 200, and 500) and systems (e.g., system 1000) described above may all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., apparatuses 100, 200, and 500) and systems (e.g., system 1000), and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to operate or simulate the operation of various potential embodiments.

The apparatus and systems of various embodiments may include or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

One or more embodiments described herein include apparatus and methods to store data in a first semiconductor memory unit and to store error correction information in a second semiconductor memory unit to recover the data. The error correction information has a value equal to at least the value of the data store in the first memory unit. Other embodiments including additional apparatus, systems, and methods are described above with reference to FIG. 1 through FIG. 10.

In some embodiments, apparatus 100 may have alternative configurations that are different from the configuration shown in FIG. 1. For example, in a first alternative configuration, apparatus 100 may omit units 111 through 114 such that in the remaining unit 110, each die 120 itself may form a semiconductor memory unit 120 with functions similar to or identical to those of a memory unit described herein, such as the memory units described above with reference to FIG. 1, FIG. 2, FIG. 3, and FIG. 5. Thus, in the first alternative configuration of apparatus 100 of FIG. 1, only one of dice 120 (memory units in this alternative configuration) may store error correction information associated with all data stored in the other dice 120, like the storing of error correction information and data in the memory units of apparatus 200 of FIG. 2 and FIG. 3. In the first alternative configuration, instead of only one die 120 storing error correction information, each of dice 120 may also store data and error correction information associate with data stored in the other dice, like the storing of error correction information and data in the memory units of apparatus 500 of FIG. 5. In the first alternative configuration, dice 120 of apparatus 100 of FIG. 1 may be enclosed in multiple separate IC packages or in the same IC package, similar to IC package 900 of FIG. 9.

In a second alternative configuration of apparatus 100 of FIG. 1, semiconductor memory units 110 through 114 may have a different organization, such that components (e.g., dice) from different units may form a semiconductor memory unit. For example, in the top row of the dice of FIG. 1, die 120, die 121, die 122, die 123, and die 124 may form a first semiconductor memory unit of apparatus 100. In another row of the dice of apparatus 100, die 120, die 121, die 122, die 123, and die 124 may form a second semiconductor memory unit. Similarly, the dice in other rows of apparatus 100 may form other semiconductor memory units of apparatus 100. In the second alternative configuration, the functions of the semiconductor memory units may be similar to or identical to those of the memory units described herein, such as the memory units described above with reference to FIG. 1, FIG. 2, FIG. 3, and FIG. 5.

In further embodiments, dice 920 of IC package 900 of FIG. 9 may form multiple semiconductor memory units. For example, a first portion of each die 920 may be combined to form a first semiconductor memory unit of IC package 900, a second portion of each die 920 may be combined to form a second semiconductor memory unit of IC package 900. Similarly, other portions of each die may be combined to form other semiconductor memory units of IC package 900. The functions of the semiconductor memory units formed from different portions of separate dice in IC package 900 may be similar to or identical to those of the memory units described herein, such as the memory units described above with reference to FIG. 1, FIG. 2, FIG. 3, and FIG. 5. When dice 920 form semiconductor memory units from different portions of each die, dice 920 may not have to be enclosed in the same IC package, such as IC package 900, dice 920 may be enclosed in separate IC packages.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples typify possible variations. Portions and features of some embodiments may be included in, or substituted for, those of other embodiments. Many other embodiments will be apparent to those of skill in the art upon reading and understanding the above description.

The Abstract is provided to comply with 37 C.F.R. § 1.72(b) requiring an abstract that will allow the reader to quickly ascertain the nature and gist of the technical disclosure. The Abstract is submitted with the understanding that it will not be used to interpret or limit the claims.

What is claimed is:

1. An apparatus comprising:
   a first semiconductor memory unit configured to store data having a first value;
   a second semiconductor memory unit configured to store error correction information to recover the data, the error correction information having a value based on at least the first value; and
   a controller coupled to the first and second semiconductor memory units, the first semiconductor memory unit including a local controller configured to detect errors in data in the first semiconductor memory unit and configured to notify the controller coupled to the first and second semiconductor memory units of the errors in order to allow the controller coupled to the first and second semiconductor memory units to recover data that has the errors, wherein, the first semiconductor memory unit is selected to store the data based on a value of a first group of bits of an address transferred between the controller and the first and second semiconductor memory units; and the second semiconductor memory unit is selected to store the error correction information based on a value of a second group of bits of the address, wherein the first semiconductor memory unit is selected to store the data if the value of the first group of bits is equal to the value of the second group of bits.

2. The apparatus of claim 1 further comprising at least one additional semiconductor memory unit configured to store an additional data having an additional value, wherein the value of the error correction information is equal to a sum of at least the first value and the additional value.

3. The apparatus of claim 2, wherein the first semiconductor memory unit, the second semiconductor memory unit, and the least one additional semiconductor memory unit are at least a part of an M total number of semiconductor memory units of the apparatus, wherein M is equal to N plus one, and wherein N is equal to $2^X$, and X is an integer equal to least one.

4. The apparatus of claim 2, wherein the first semiconductor memory unit, the second semiconductor memory unit, and the least one additional semiconductor memory unit are enclosed in a same integrated circuit package.

5. The apparatus of claim 2, wherein the first semiconductor memory unit, the second semiconductor memory unit, and the least one additional semiconductor memory unit are enclosed in separate integrated circuit packages.

6. The apparatus of claim 1, wherein the value of the error correction information is equal to the first value.

7. The apparatus of claim 1, wherein the error correction information is a first error correction information, the data is a first data, wherein the second semiconductor memory unit is further configured to store a second data having a second value, and wherein the first semiconductor memory unit is further configured to store a second error correction information having a value based on at least a value of the second data.

8. The apparatus of claim 1, wherein the second semiconductor memory unit is selected to store the error correction information if the value of the first group of bits is not equal to the value of the second group of bits.

* * * * *